(12) United States Patent
Meyer et al.

(10) Patent No.: US 12,208,483 B2
(45) Date of Patent: Jan. 28, 2025

(54) MICROREPLICATED POLISHING SURFACE WITH ENHANCED CO-PLANARITY

(71) Applicant: 3M INNOVATIVE PROPERTIES COMPANY, St. Paul, MN (US)

(72) Inventors: Kenneth A. P. Meyer, Eagan, MN (US); John J. Sullivan, Hudson, WI (US); Brian W. Lueck, Houlton, WI (US); Duy K. Lehuu, Lake Elmo, MN (US); David J. Muradian, St. Paul, MN (US); David F. Slama, City of Grant, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 1396 days.

(21) Appl. No.: 16/636,348

(22) PCT Filed: Aug. 2, 2018

(86) PCT No.: PCT/IB2018/055815
§ 371 (c)(1),
(2) Date: Feb. 4, 2020

(87) PCT Pub. No.: WO2019/026021
PCT Pub. Date: Feb. 7, 2019

(65) Prior Publication Data
US 2020/0164484 A1    May 28, 2020

Related U.S. Application Data

(60) Provisional application No. 62/541,362, filed on Aug. 4, 2017.

(51) Int. Cl.
*B24B 37/26* (2012.01)
*B24B 37/22* (2012.01)
(Continued)

(52) U.S. Cl.
CPC ............. *B24B 37/26* (2013.01); *B24B 37/22* (2013.01); *B24B 37/24* (2013.01); *B24D 3/28* (2013.01);
(Continued)

(58) Field of Classification Search
CPC ... B24D 3/26; B24D 3/28; B24D 3/32; B24D 11/001; B24D 2203/00; B24B 37/22; B24B 37/24; B24B 37/26
See application file for complete search history.

(56) References Cited

U.S. PATENT DOCUMENTS 3,211,811 A   10/1965  Lanman
5,489,233 A    2/1996  Cook
(Continued)

FOREIGN PATENT DOCUMENTS

CN    204277743 U    4/2015
JP    2011235425 A   11/2011
(Continued)

OTHER PUBLICATIONS

International Search Report for PCT International Application No. PCT/IB2018/055815, mailed on Nov. 20, 2018, 2 pages.

*Primary Examiner* — Joel D Crandall
(74) *Attorney, Agent, or Firm* — Jonathan L. Tolstedt

(57) ABSTRACT

An article includes a polishing layer that includes a plurality of raised cells separated by a plurality of channels. Each of the plurality of raised cells includes a microstructured working surface, a substantially vertical channel surface, and an offset surface between an edge of the working surface and an upper edge of the channel surface. The microstructured working surface includes a plurality of microstructures. Tops of the plurality of microstructures define a top plane and bases of the plurality of microstructures define a base plane. The substantially vertical channel surface defines a wall of (Continued)

a channel of the plurality of channels and the channel surface defines a channel plane. The offset surface includes a nonplanar portion of displaced material. The displaced material defines a displacement plane that is below the base plane or within a tolerance of the top plane.

15 Claims, 11 Drawing Sheets

(51) Int. Cl.
- *B24B 37/24* (2012.01)
- *B24D 3/28* (2006.01)
- *B24D 11/00* (2006.01)
- *B29L 31/00* (2006.01)
- *H01L 21/304* (2006.01)
- *H01L 21/306* (2006.01)

(52) U.S. Cl.
CPC .......... *B24D 11/00* (2013.01); *B24D 2203/00* (2013.01); *B29L 2031/736* (2013.01); *H01L 21/304* (2013.01); *H01L 21/30625* (2013.01)

(56) References Cited

U.S. PATENT DOCUMENTS

| | | | |
|---|---|---|---|
| 6,285,001 B1 | 9/2001 | Fleming | |
| 6,439,986 B1* | 8/2002 | Myoung | B24B 53/017 451/443 |
| 6,699,115 B2 | 3/2004 | Osterheld et al. | |
| 6,780,095 B1* | 8/2004 | Moore | B24B 37/26 451/527 |
| 6,837,780 B1* | 1/2005 | Broido | B24B 37/16 451/527 |
| 7,160,178 B2 | 1/2007 | Gagliardi | |
| 7,169,029 B2* | 1/2007 | Petersen | B24D 11/005 451/529 |
| 7,226,345 B1* | 6/2007 | Dornfeld | B24B 37/26 451/287 |
| 7,238,093 B1* | 7/2007 | Sakamoto | B24B 37/26 451/527 |
| 7,410,413 B2* | 8/2008 | Woo | B24D 11/001 451/529 |
| 7,828,634 B2* | 11/2010 | Jiang | B24B 37/24 451/526 |
| 2004/0003895 A1 | 1/2004 | Amano | |
| 2006/0030241 A1 | 2/2006 | Chang | |
| 2006/0178099 A1 | 8/2006 | Hishiki | |
| 2007/0128991 A1* | 6/2007 | Yoon | B24B 37/26 451/285 |
| 2010/0188751 A1 | 7/2010 | Clarke | |
| 2011/0053460 A1* | 3/2011 | Culler | B24D 11/00 428/161 |
| 2013/0225052 A1* | 8/2013 | Song | B24B 53/017 427/556 |
| 2014/0113532 A1* | 4/2014 | Smith | B24B 53/017 451/443 |
| 2014/0273777 A1* | 9/2014 | Lefevre | B24B 37/26 451/529 |
| 2015/0158141 A1* | 6/2015 | Aoki | B24D 11/00 451/529 |
| 2016/0221146 A1 | 8/2016 | Lugg | |

FOREIGN PATENT DOCUMENTS

| | | |
|---|---|---|
| JP | 2013193181 A | 9/2013 |
| WO | 9527595 A1 | 10/1995 |
| WO | 2009032815 A1 | 3/2009 |
| WO | WO 2011/082155 A2 | 7/2011 |
| WO | 2012102978 A1 | 8/2012 |
| WO | 2014116491 A1 | 7/2014 |
| WO | WO 2015/048011 A1 | 4/2015 |
| WO | 2015153597 A1 | 10/2015 |
| WO | WO 2015-153601 | 10/2015 |
| WO | WO 2016-183126 | 11/2016 |
| WO | WO 2017-062719 | 4/2017 |

* cited by examiner

MICROREPLICATED POLISHING SURFACE WITH ENHANCED CO-PLANARITY

CROSS REFERENCE TO RELATED APPLICATIONS

This application is a national stage filing under 35 U.S.C. 371 of PCT/IB2018/055815, filed Aug. 2, 2018, which claims the benefit of U.S. Provisional Application No. 62/541,362, filed Aug. 4, 2017, the disclosure of which is incorporated by reference in its entirety herein.

BACKGROUND

Chemical mechanical polishing (CMP) is a process for smoothing the topography of a surface. A polishing pad is rotated at high speed and an article is pressed against a surface of the polishing pad. An abrasive slurry is added at the contact surface between the polishing pad and the article. The abrasive slurry contacts the article and removes material from the article.

CMP may be used in the manufacture of integrated circuits. For example, during manufacture of an integrated circuit, an oxide layer may have trenches created by lithography and a copper layer may be deposited onto the oxide layer to fill the trenches. A CMP process may remove any excess copper on the surface of the integrated circuit to expose the oxide layer and leave isolated copper wires in the trenches. As semiconductor manufacturing moves to smaller and denser features in ever more complex integrated circuits, a greater number of planarization steps may be required at reduced tolerances.

SUMMARY

According to embodiments of the disclosure, an article includes a polishing layer. The polishing layer includes a plurality of raised cells separated by a plurality of channels. Each of the plurality of raised cells includes a microstructured working surface, a substantially vertical channel surface, and an offset surface between an edge of the working surface and an upper edge of the channel surface. The microstructured working surface includes a plurality of microstructures. Tops of the plurality of microstructures define a top plane and bases of the plurality of microstructures define a base plane. The substantially vertical channel surface defines a wall of a channel of the plurality of channels and the channel surface defines a channel plane.

In some examples, a system includes a carrier assembly configured to hold a substrate, a polishing pad that includes the article described above, a platen coupled to the polishing pad, and a polishing solution comprising a fluid component and an abrasive component. The system is configured to move the polishing pad relative to the substrate.

In some examples, a method includes providing a substrate having a major surface, a polishing pad that includes the article described above, and a polishing solution that includes a fluid component and an abrasive component. The method further includes contacting the major surface of the substrate with the polishing pad and the polishing solution while there is relative motion between the polishing pad and the major surface of the substrate.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like symbols in the drawings indicate like elements. Dotted lines indicate optional or functional components, while dashed lines indicate components out of view.

DETAILED DESCRIPTION

Figure 1:
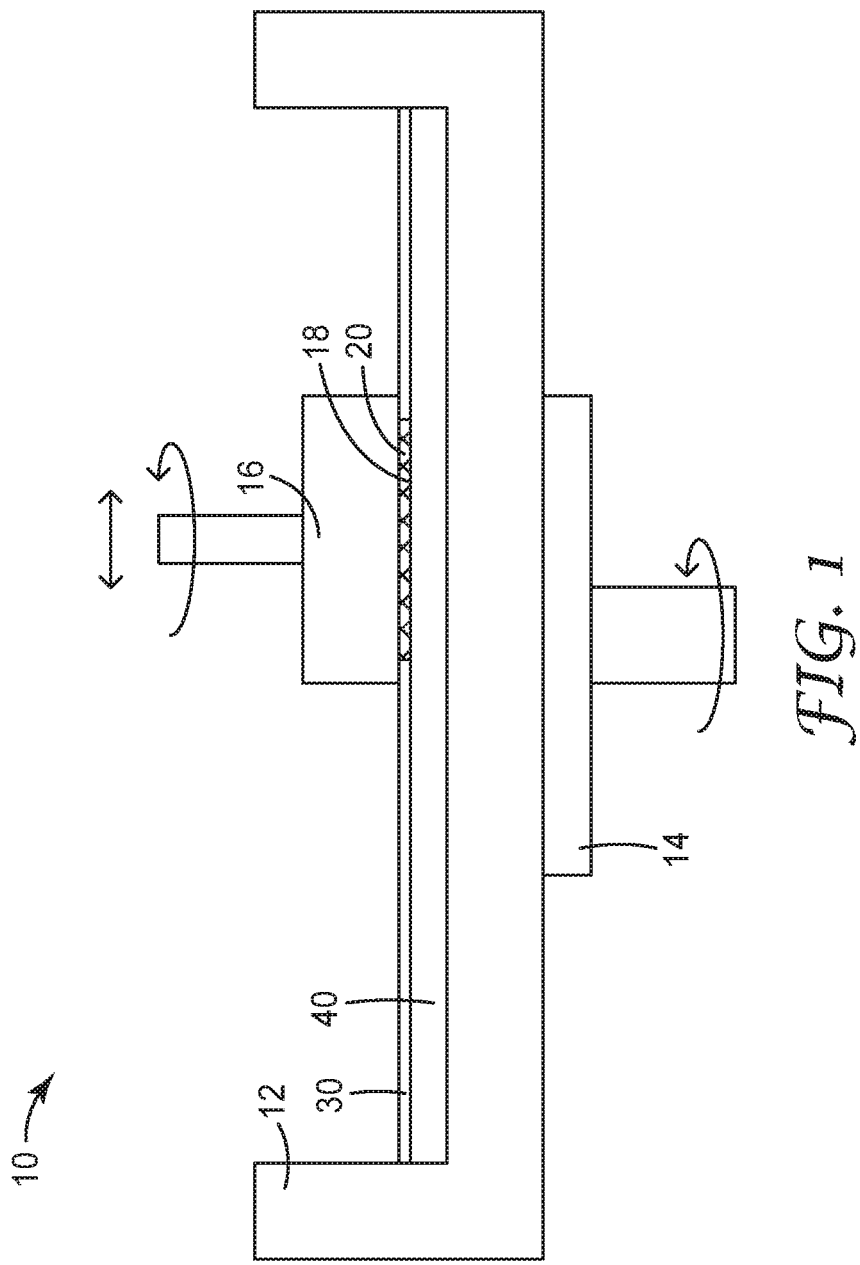
FIG. 1 illustrates a schematic diagram of an example polishing system for utilizing the articles and methods in accordance with some embodiments discussed herein.

Chemical mechanical polishing (CMP) processes may remove material from an article by contacting an abrasive slurry against a surface of the article. CMP polishing pads may be fabricated using microreplication techniques that create microstructured surfaces on the CMP polishing pads. Microreplication may include fabrication techniques wherein topographical features are prepared by casting or molding a polymer in a production tool. These microreplication techniques may create the microstructures by displacing polymer. For example, in embossing, a polymer melt may be extruded onto a negative mold. A pressure may be applied to the polymer melt, forcing the polymer melt into topographical features of the negative mold that correspond to microstructures. For example, a microreplication tool configured to form a pore or cavity may displace material to form the pore or cavity. The polymer melt may cool to form a solid polymer film having the microstructures. Upon removing the polymer from the production tool, a series of topographical features are present in the surface of the polymer.

When polymer is displaced during the microreplication process, the displaced polymer may form raised or lowered structures that create an uneven active polishing surface on the polishing pad. For example, in the embossing example above, projections in microreplication tools configured to form trenches may displace enough polymer so that polymer aggregates at edges and corners of the polymer film along tooling ridges used to create the trenches, causing the edges and corners to be raised in areas corresponding to the edges of the projections. During polishing or pre-polishing, these raised edges and corners may be worn off before or to a greater extent than remaining portions of the polishing surface, thereby creating an uneven polishing surface that may lower removal rate and cause uneven polishing of a substrate.

While not being limited to any particular theory, it is theorized that one contributor to aggregation of polymer may be due to distortion caused by sag in the microreplication tool. For example, a cylindrical roll may have a sag produced by the curvature of the microreplication tool, as in the following equation:

$$SAG = R - \sqrt{\left(R^2 - \left(\frac{D}{2}\right)^2\right)}$$

In the above equation, SAG represents sag of the tool, R represents radius of the tool, and D represent a length of a cell in the downtool dimension. For a 4.2 mm lens having a 150 mm radius of curvature, the sag may be about 15 microns. Another contributor to aggregation of polymer in defects may be due to expansion and/or contraction of the polymer upon cooling.

Another contributor to displacement of polymer may be due to a coefficient of thermal expansion (CTE) mismatch between two or more layers. For example, a polishing pad may have a polishing layer and one or more secondary layers such as subpads or adhesive layers having different CTEs than the polishing layer. During fabrication, the polishing layer of the polishing pad may be a hot polymer melt on which microstructures are replicated and subsequently cooled. During cooling, the polishing layer may contract at a different rate than a secondary layer, causing displacement of polymer. The polymer may be displaced by forming positive displacement or peaks or negative displacement or troughs, depending on the direction of the CTE mismatch. This polymer displacement may apply to microreplication methods that directly displacement polymer, such as extrusion, as well as microreplication methods that do not directly displace polymer, such as compression molding.

Figure 8A:
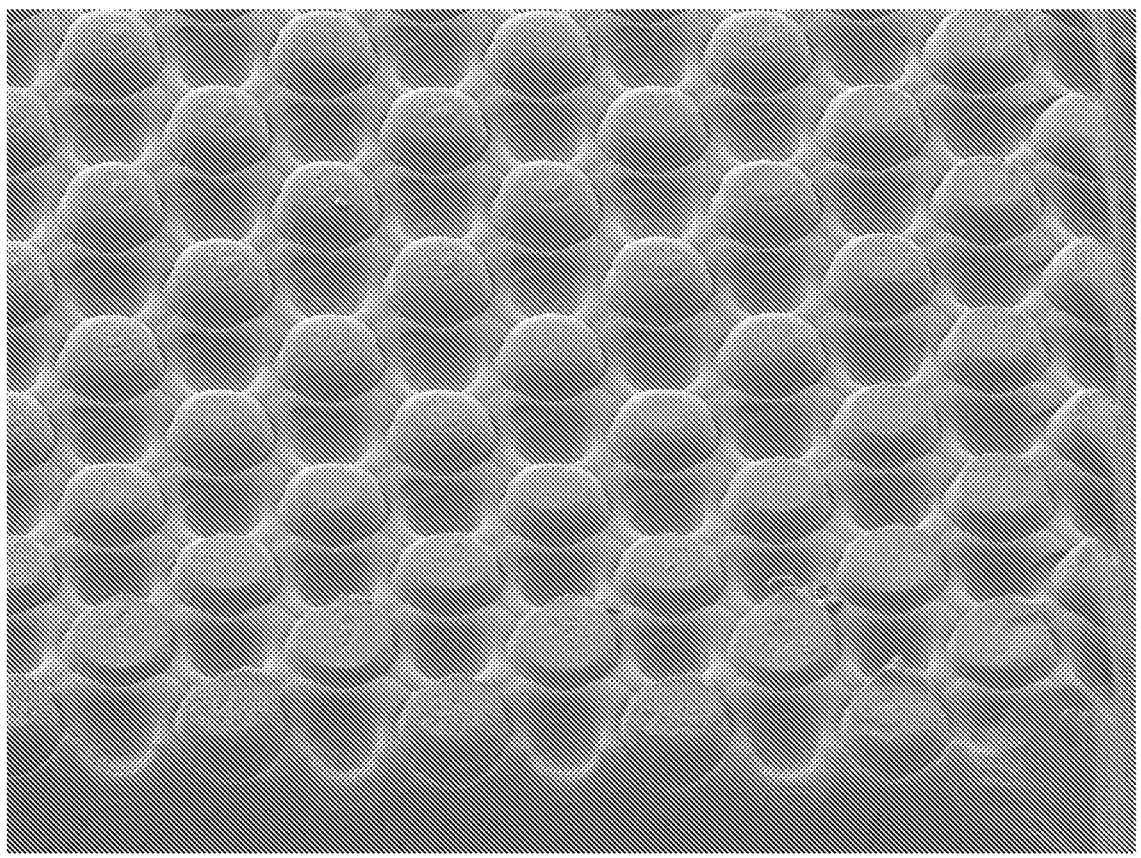
FIG. 8A is a scanning electron micrograph of a cell in accordance with some embodiments discussed herein.
Figure 8B:
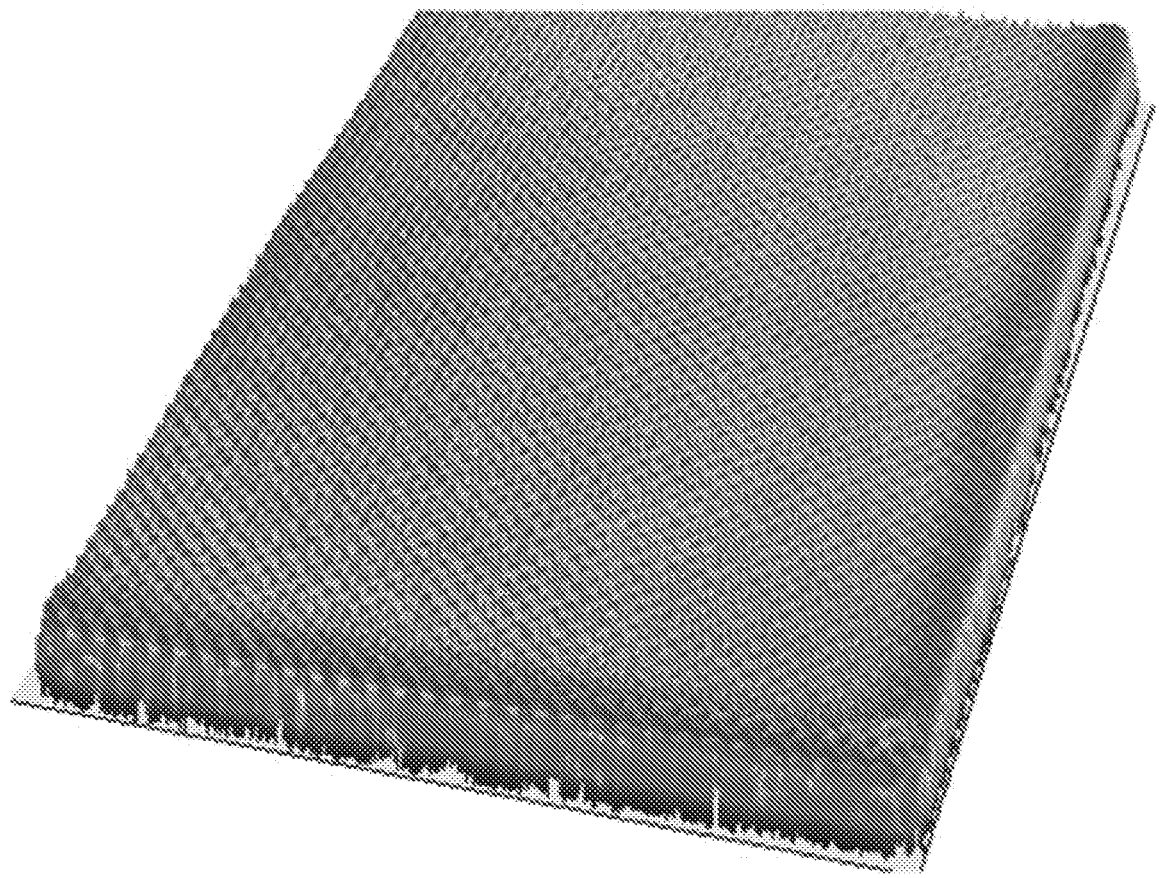
FIG. 8B is a height map of a cell in accordance with some embodiments discussed herein.
Figure 8C:
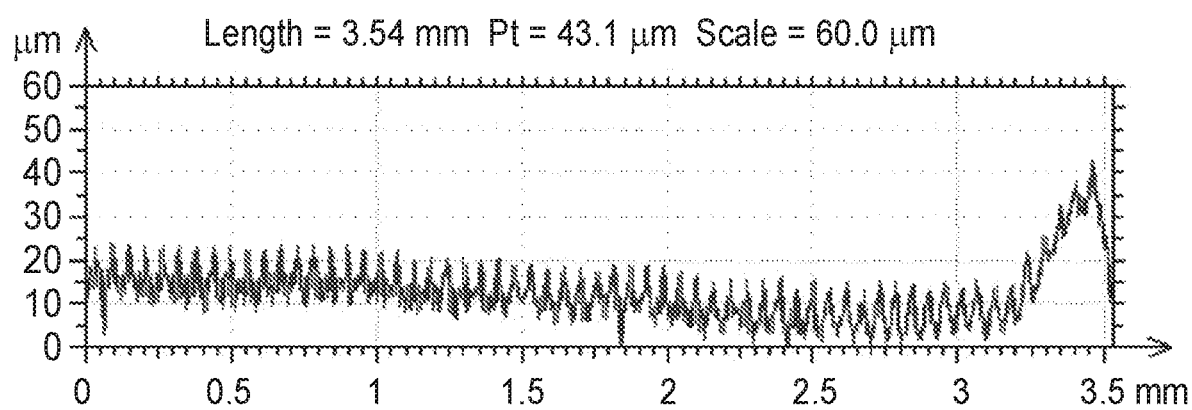
FIG. 8C is a cross-section of a height map of the cell of FIG. 8B in accordance with some embodiments discussed herein.

FIG. 8A is a scanning electron micrograph illustrating an exemplary conditioned cell having defects caused by aggregation of excessive polymer along edges of the cell. The example conditioned cell has microstructures that include raised asperities and lowered pores. During conditioning, the polishing surface of the polishing pad may be ground to expose surfaces of the raised asperities for a particular polishing property, such as roughness or asperity height. The excessive polymer defect at the corner of the cell causes the microstructures near the defect to be raised or lowered, which results in a longer conditioning period and non-planarity of the conditioned surface. FIG. 8B is a height map of a cell that includes raised defects, while FIG. 8C is a cross-section of the height map of the cell of FIG. 8B. As seen in FIG. 8B, edges of a cell on the polishing pad are raised on two sides of the cell. These raised edges may correspond to a trailing edge of a microreplication tool used to create the polishing pad, where material is most likely to form a defect. As seen in FIG. 8C, the height of the polishing pad at an edge is significantly higher than the rest of the polishing pad, such that a land between asperities at the edge may be reached before the other asperities are conditioned.

The present disclosure relates to a polishing pad having features configured to enhance co-planarity on an active polishing surface of the polishing pad. The polishing pad may include a plurality of polishing cells separated by channels. The polishing cells may have a working surface and an offset volume adjacent to the working surface. This offset volume may act as an expansion or contraction volume for polymer displaced during or after microreplication of the polishing pad. The resulting polishing pads may have a more uniform pad thickness that reduces conditioning and break-in time, which may further reduce slurry consumption and increase pad life. A replication tool configured to produce the above described polishing pads may have a precise design and produce consistent replication of an active working surface for manufacturing the polishing pads.

CMP processes may remove material from a substrate using the articles and techniques discussed herein. FIG. 1 illustrates a schematic of an example polishing system 10 for utilizing the articles and methods in accordance with some embodiments discussed herein. System 10 may include a platen 12, a drive assembly 14, a carrier assembly 16, a substrate 20, a polishing solution 30, and a polishing pad 40. Platen 12 may be configured to house and/or secure polishing pad 40. Drive assembly 14 may be coupled to platen 12 and configured to rotate platen 12 and, correspondingly, polishing pad 40. Carrier assembly 16 may be coupled to substrate 20 and configured to rotate substrate 20, move substrate 20 across a plane of polishing pad 40, and press substrate 20 against polishing pad 40 at a polishing surface 18 of substrate 20. Polishing solution 30 and polishing pad 40, alone or in combination, may remove material of substrate 20 at polishing surface 18.

While a circular, single-sided polishing system 10 has been described above, other polishing systems may be used. For example, more than one polishing pad may contact a substrate, as in a double-sided polisher. Other example systems include, but are not limited to, oscillating polishers, double-sided polishers, and the like.

The substrate may be any substrate for which polishing and/or planarization is desirable. For example, the substrate may be a metal, metal alloy, metal oxide, ceramic, polymer, or the like. In some embodiments, the methods of the present disclosure may be particularly useful for polishing ultrahard substrates such as sapphire, silicon, silicon carbide, quartz, silicate glasses, or the like. The substrate may include one or more surfaces to be polished.

Figure 2:
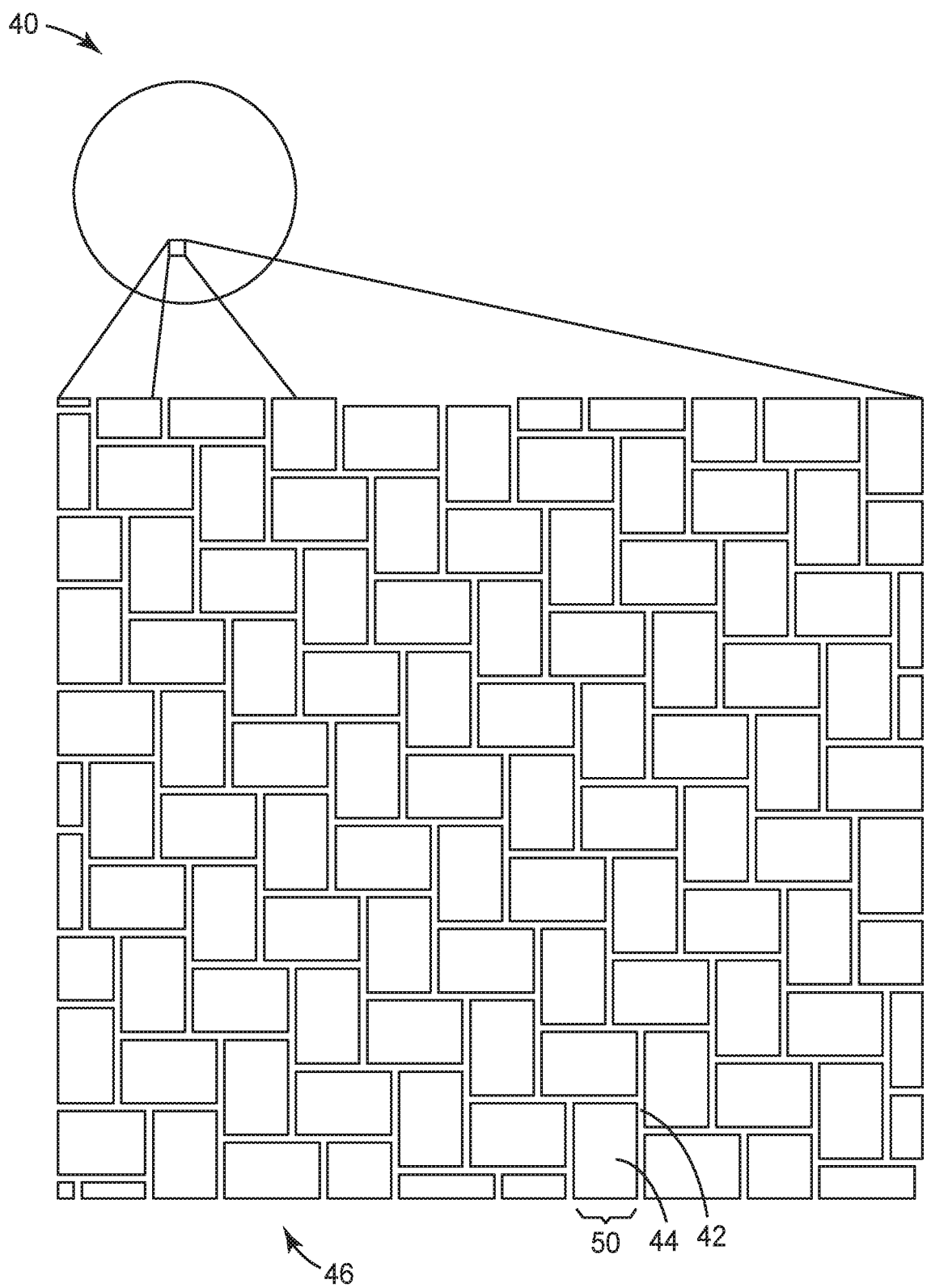
FIG. 2 illustrates a perspective top view of a portion of an example polishing pad in accordance with some embodiments discussed herein.

Polishing pad 40 may include a polishing layer configured with a plurality of cells and channels that provide an even polishing surface with reduced material displacement defects. FIG. 2 illustrates a perspective top view of a polishing layer 46 of polishing pad 40 in accordance with some embodiments discussed herein. Polishing layer 46 may include a plurality of raised cells 50 separated by a plurality of channels 42. Each cell of the plurality of cells 50 may include a microstructured working surface 44. Working surface 44 may represent a surface of polishing layer 46 that will be adjacent to and in at least partial contact with the surface of the substrate being polished. While not explicitly shown due to size, each microstructured working surface 44 may include a plurality of microstructures extending from working surface 44, as will be further described in FIGS. 5A-5D.

The plurality of cells 50 may be configured to remove material from a substrate and provide a substantially consistent working surface 44 for polishing pad 40 over the life of polishing pad 40. A substantially consistent working surface may be a polishing surface that has a substantially even plane, such that an even pressure on polishing pad 40 does not produce large local pressure modulations on a substrate during polishing. The plurality of cells 50 may be configured to reduce the negative surface effects of manufacturing defects by providing an offset volume to contain the manufacturing defects below working surface 44 of the respective cell through the polishing life of the cell, as will be described in more detail in FIGS. 3A and 3B below. The plurality of cells 50 may be distributed across some or all the surface of polishing layer 46. Spaces between cells of the plurality of cells 50 may form a channel of the plurality of channels 42.

The plurality of cells 50 may have a variety of shapes and sizes. The plurality of cells 50 may have shapes and sizes that are configured for a variety of factors, such as projection wear, pressure profile, bearing area, channel volume, surface area, channel area, optical slurry flow, cell height, and the like. Shapes of the plurality of cells may include, but are not limited to: polygonal, such as rectangular and triangular; round shapes, such as circular and oval; and other shapes that may be formed by repetitive patterns. In some examples, cells 50 may have a cell height, cell width, and cell length. In some examples, a cell length or diameter may be in a range between 100 µm and 1 cm and a cell width or diameter may be in a range between 100 µm and 1 cm. In some examples, a cell height may be selected to accommodate a microstructured working surface 44 on each respective cell through the life of polishing pad 40, such that each cell is sufficiently thick to include the microstructures and provide a desired amount of wear for polishing pad 40. In some examples, a cell height may be configured to accommodate one or more channel walls of the plurality of channels, such that each channel of the plurality of channels has sufficient height to contain and transfer polishing slurry at a desired rate. In some examples, a cell height may be configured to allow for the plurality of cells 50 to sufficiently move during polishing, such that a polishing force may be more have a more normalized force distribution over a contacting surface area than cells that may not move. For example, a greater cell height may allow polishing pad to have more flexibility and distortion, which may result in a more even polishing surface. In some examples, a cell height may be in a range between 10 µm and 1 mm.

The plurality of channels 42 may be configured to contain and transfer polishing slurry during polishing. The plurality of channels 42 may have shapes and patterns configured to guide polishing fluid along a tortuous path according to the desired fluid flow properties of the polishing fluid, such as flow rate, spent abrasive removal, material removal, and the like. For example, it may be desired to reduce a flow of polishing fluid from polishing pad 40, so as to conserve polishing fluid. The plurality of channels may be configured to create a tortuous path for polishing fluid, such that a polishing fluid retention time is increased. In other examples, it may be desired to increase a flow of spent polishing fluid and/or removed polishing pad or substrate material from a polishing surface of polishing pad 40. The plurality of channels may be configured to reduce a speed of flow of polishing solution and/or allow polishing solution to reflow to working surface 44. The plurality of channels 42 may provide improved polishing solution distribution and polishing layer flexibility, as well as facilitate swarf removal from the polishing pad.

The plurality of channels 42 may have a variety of sizes, including variations in a channel width and a channel height. The height and width of the plurality of channels 42 may be selected based on a variety factors, including polishing pad speed, polishing solution viscosity, polishing solution abrasive size, and other factors that affect polishing surface contact, polishing fluid transfer, and the like. For example, a width of the plurality of channels 42 may be selected so that, for a particular polishing pad speed and polishing fluid viscosity, polishing fluid may adequately transfer to a polishing surface. In some examples, a channel width may be in a range between about 100 µm and about 20 mm. In some examples, a channel height may be in a range between about 50 µm and about 15 mm, or up to a height of the cell.

The plurality of cells 50 and plurality of channels 42 may form a pattern on top major surface 44. The pattern may be selected based on a variety of factors, including polishing pad speed, polisher type (such as rotating or linear), and other factors that affect polishing surface contact and/or polishing solution transfer during polishing. In some examples, the plurality of cells 50 may be evenly distributed across top major surface 44 to form a symmetrical pattern, while in some examples, the plurality of cells 50 may have an asymmetrical pattern or no pattern. In some examples, a pattern of the plurality of cells 50 and plurality of channels 42 is configured to create a path of channels such that a fluid retention time in the plurality of channels 42 is increased. In some examples, the pattern is a herringbone pattern, as illustrated in the example of FIG. 2.

Figure 3A:
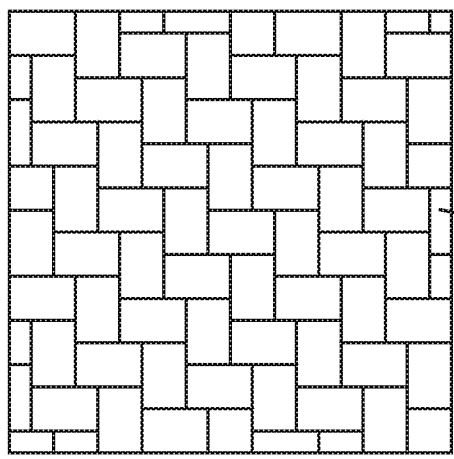
FIG. 3A is a diagram of a polishing layer having a plurality of straight, continuous channels arranged in a herringbone pattern, in accordance with some embodiments discussed herein.
Figure 3B:
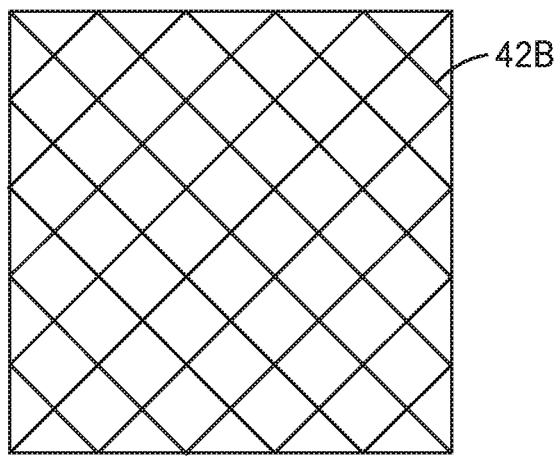
FIG. 3B is a diagram of a polishing layer having a plurality of straight, continuous channels arranged in a cross-hatch pattern, in accordance with some embodiments discussed herein.
Figure 3C:
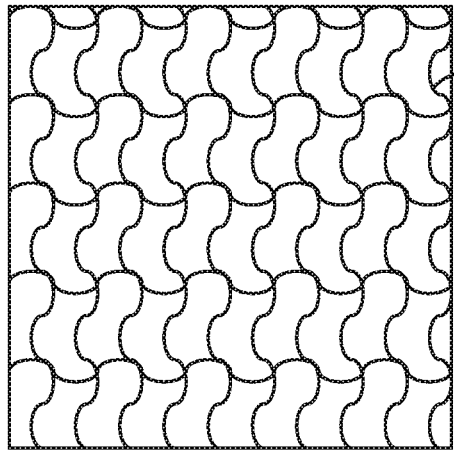
FIG. 3C is a diagram of a polishing layer having a plurality of curved, continuous channels arranged in a cross-hatch pattern, in accordance with some embodiments discussed herein.
Figure 3D:
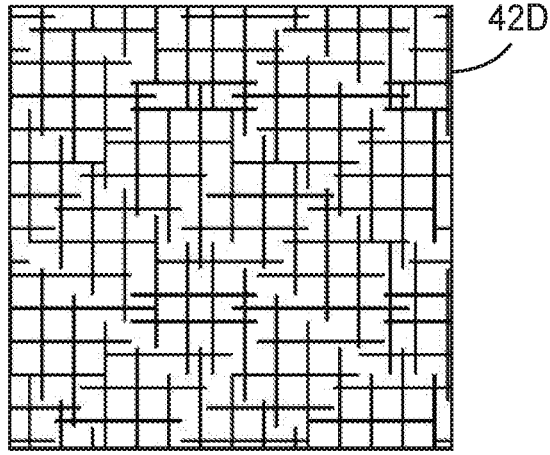
FIG. 3D is a diagram of a polishing layer having a plurality of straight, discontinuous channels arranged in a cross-hatch pattern, in accordance with some embodiments discussed herein.

FIGS. 3A-3D are diagrams of polishing layers having various patterns of the plurality of channels. FIG. 3A is a diagram of polishing layer 46A having a plurality of straight, discontinuous channels 42A arranged in a herringbone pattern. The herringbone pattern has a tortuous path that includes hard stops and changes of direction. FIG. 3B is a diagram of polishing layer 46B having a plurality of straight, continuous channels 42B arranged in a cross-hatch pattern. While the cross-hatch pattern may not have as tortuous a path as the herringbone pattern of FIG. 3A, it may be simpler to fabricate using microreplication tools. FIG. 3C is a diagram of polishing layer 46C having a plurality of curved, continuous channels 42C arranged in a cross-hatch pattern. The plurality of curved, continuous channels 42C may create a more tortuous path while allowing microreplication from a continuous, sinusoidal microreplication tool. FIG. 3D is a diagram of a polishing layer having a plurality of straight, discontinuous channels arranged in a cross-hatch pattern.

Referring back to FIG. 2, polishing pad 40 may have a variety of shapes and sizes. Polishing pad 40 may have a shape and size that is compatible with features of system 10, such as a shape of platen 12 or movement of drive assembly 14. In some examples, polishing pad 40 may have a circular shape, as in a circular polishing form; a rectangular shape, as in a sheet or belt polishing form; or the like. In some examples, polishing pad 40 may have a diameter in a range of 25 to 100 cm or a surface area in a range of 500 to 7500 cm$^2$.

Polishing pad 40 may have any suitable thickness for polishing a particular substrate. The thickness of polishing pad 40 may influence the stiffness of polishing layer 46, which in turn can affect polishing results, particularly the planarity and/or flatness of substrate 20 being polished. In some embodiments, the thickness of the polishing pad layer ranges between 0.125 mm and 10 mm. In some embodiments, the shape of the polishing pad arrangement may conform to the shape of platen 12 upon which the multi-layered polishing pad arrangement is to be mounted. For example, the polishing pad arrangement may be configured in the shape of a circle or annulus having a diameter that corresponds to the diameter of a platen upon which the multi-layered polishing pad arrangement is to be mounted. In some embodiments, the polishing pad arrangement may conform to the shape of platen 12 within a tolerance of ±10%.

Polishing pad 40 can be formed according to a variety of methods that displace material during formation including, e.g., molding, extruding, embossing and combinations thereof. In illustrative embodiments, polishing layer 46 and any other polishing pad layer may be formed of a polymeric material. For example, polishing layer 46 of polishing pad 40 may be formed from thermoplastics, for example; polypropylene, polyethylene, polycarbonate, polyurethane, polytetrafluoroethylene, polyethylene terephthalate, polyethylene oxide, polysulphone, polyether ketone, polyether ether ketone, polyimides, polyphenylene sulfide, polystyrene, polyoxymethylene plastic, and the like; thermosets, for example polyurethanes, epoxy resin, phenoxy resins, phenolic resins, melamine resins, polyimides and urea-formaldehyde resins, radiation cured resins, or combinations thereof. In some embodiments, any of the polishing pad layers may be formed from a soft metal material such as, for example copper, tin, zinc, silver, bismuth, antimony, or alloys thereof. The polishing pad layers may consist essentially of only one layer of material, or may have a multi-layered construction.

In some embodiments, polishing pad 40 may include one or more additional layers. For example, the polishing pad may include adhesive layers such as pressure sensitive adhesives, hot melt adhesives, or epoxies. "Sub pads" such as thermoplastic layers, e.g. polycarbonate layers, which may impart greater stiffness to the pad, may be used for global planarity. Sub pads may also include compressible material layers, e.g. foamed material layers. Sub pads which include combinations of both thermoplastic and compressible material layers may also be used.

While the previous embodiments have been described with respect to polishing pads having a polishing layer 46 that is planar, it is to be appreciated that any number of non-planar orientations may be employed without deviating from the scope of the preset disclosure. For example, polishing layer 46 may be in the form of continuous belt. Such non-planar polishing pads could be coupled to an appropriate carrier assembly (e.g., platen 12 or axel) that is capable of rotating the polishing pad such that it contacts the substrate to be polished.

Polishing layer 46 may be formed from a polymer sheet. During formation of polishing layer 46, material may be displaced to create the plurality of channels 42 and the plurality of cells 50, including the microstructured working surfaces 44 of the plurality of cells 50, or through thermal expansion or contraction. As explained above, this material may congregate or recede at a portion of cell 50, such as an edge, causing working surface 44 to have defects. To reduce these defects at polishing surfaces, microreplication tools may compensate for these defects by designing cells 50 to accommodate or minimize the defects along edges of cells 50 below the polishing surfaces. Cells 50 may be structured to create an offset volume so that material displaced may congregate in the offset volume, which may reduce or eliminate a surface contact effect of the material on polishing. FIGS. 3A and 3B illustrate perspective views of a cell 50 in accordance with some embodiments discussed herein. In these examples, cell 50 may include features that compensate for the displacement and/or expansion of material during manufacture.

Figure 4A:
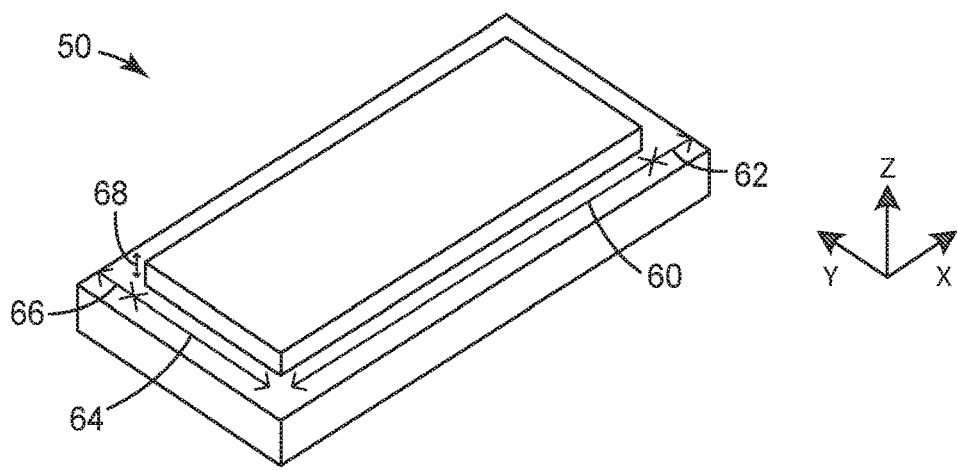
FIG. 4A illustrates a perspective view of an example cell in accordance with some embodiments discussed herein.

FIG. 4A illustrates a perspective view of a cell design for cell 50. In the example of FIG. 4A, cell 50 may be an idealized cell design for which a microreplication tool is designed to produce. As will be illustrated in FIG. 4B below, displaced material may gather at edges of cell 50, such that surfaces of cell 50 may be rough, varied, or otherwise inconsistent and/or out-of-plane with the design of FIG. 4A. Cell 50 may be a cell from the plurality of cells 50 of polishing layer 46 of FIG. 2. Cell 50 may include a microstructured working surface 44, a substantially vertical channel surface 52, and an offset surface 54 between an edge of working surface 44 and an upper edge of channel surface 52.

Working surface 44 may be configured to contact a substrate, such as substrate 20 of FIG. 1, and polish the substrate using microstructures and/or abrasives in a polishing solution. In some examples, working surface 44 may be substantially planar, such that a contact force is relatively constant over working surface 44. Working surface 44 may include microstructures, such as asperities and pores, as will be described in FIG. 6A-5D below. In the example of FIG. 4A, working surface 44 is rectangular having a length 60 and a width 64; however, in other examples, working surface 44 may have other shapes, such as a circular shape, a triangular shape, or any other useful shape for polishing. In examples that have a slanted offset surface 54, dimensions of length 60 and width 64 may increase during polishing as working surface 44 is reduced.

Cell 50 may be laterally bound by channel surface 52. Channel surface 52 may be configured to act as walls for channels of the plurality of channels 42 of FIG. 2. Channel surface 52 may define a wall of a channel of the plurality of channels 42. In the example of FIG. 4A, channel surface 52 includes four separate surfaces to form a rectangular shape of cell 50; however, in other examples, channel surface 52 may form other shapes, such as a circular shape, a triangular shape, or any other useful shape. In some example, channel surface 52 bounds a same shape as working surface 44. In some examples, channel surface 52 may be substantially perpendicular to a plane of working surface 44. Each channel surface 52 may define a channel plane. Offset surface 54 may have an offset depth 68 that represents a depth from a plane of working surface 44 to a maximum designed depth of offset surface 68, as will be described in more detail in FIG. 4C below.

Offset surface 54 may be defined by a surface of cell 50 between an edge of working surface 44 and an upper edge of channel surface 52. Offset surface 54 may include a variety of surface orientations, as will be described in FIGS. 5A-5G below. An edge of working surface 44 may be offset from an adjacent plane of channel surface 52 by an offset length 62 and an offset width 66. In examples that have a slanted offset surface 54, dimensions of offset length 62 and offset width 66 may decrease during polishing as working surface 44 is reduced. In some examples, offset width 66 and/or offset length 62 may be between about 10 μm and 1 mm. In some examples, offset width 66 and/or offset length 62 may be between about 1% and about 50% of width 60 and/or length 64 of working surface 44.

Figure 4B:
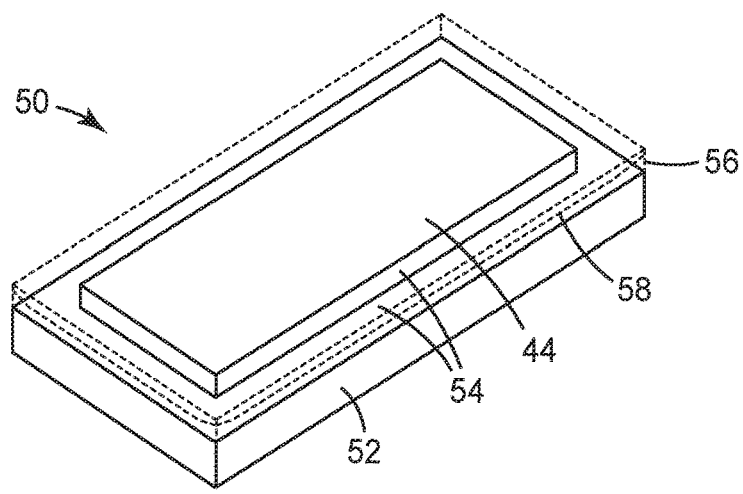
FIG. 4B illustrates a perspective view of an example cell having an offset volume in accordance with some embodiments discussed herein.

Offset surface 54 may be configured to form an offset volume to accommodate displaced material during manufacture of cells 50 of polishing layer 46. FIG. 4B illustrates a perspective view of cell 50 having an offset volume 56. Offset volume 56 may represent a volume adjacent to working surface 44. Displaced material 58 may represent material displaced during manufacture of cell 50, indicated by a dotted line in offset volume 56 and above offset surface 54. Offset volume 56 may be configured to accommodate displaced material 58 during manufacture of cells 50 of polishing layer 46. While displaced material 58 is illustrated as separate from offset surface 54, in practice, a surface of displaced material 58 may form a portion of offset surface 54.

Offset volume 56 may be defined by a plane of working surface 44, a plane of channel surface 52, and offset surface 54. In some examples, offset volume 56 may a volume that is offset from co-planarity of working surface 44. For example, offset volume 56 may be an empty volume for expansion of displaced material, such as due to material removal, or may be solid material for contraction of displaced material, such as due to CTE mismatch. In some examples, the plane of working surface 44 may represent an anticipated minimum height of working surface 44, which may be correlated to a maximum depth for which working surface 44 may be worn down. For example, the working surface 44 may be configured so that working surface 44 is substantially above a maximum anticipated height of defects on offset surface 54 of cell 50, above which a defect of the offset surface may interfere with polishing as working surface 44 is worn down. The maximum depth for which working surface 44 may be worn down may be a depth that correlates with a threshold depth, above which polishing results are deemed unacceptable. For example, defects at or above a plane of working surface 44 may cause minor polishing effects that do not substantially affect polishing, so long as such defects are in a small amount. In some examples, the plane of working surface 44 may represent an anticipated break-in height. For example, during conditioning of polishing pad 40, working surface 44 may be worn down to achieve a particular texture or set of working surface properties. For examples in which a defect height may be substantially large (such as greater than 5 μm), the plane of working surface 44 may account for a break-in height so that the defect remains substantially below working surface 44 after break-in. For examples in which a defect height may be substantially small (such as less than 5 μm), the plane of working surface 44 may be within a threshold of the defect, such that the defect is removed during the break-in and does not create non-planarity of working surface 44 after break-in.

Figure 4C:
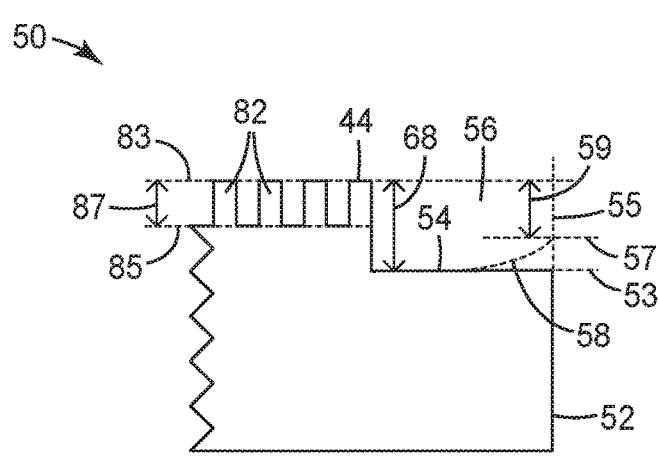
FIG. 4C illustrates a profile view of an example cell having an offset volume in accordance with some embodiments discussed herein.

Displaced material 58 may represent an amount of displaced material that has accumulated at an edge of cell 50. As seen in the example of FIG. 4B, a height of displaced material 58 is less than a height of working surface 44 or an intended final working thickness of working surface 44, such that, during polishing, working surface 44 will form a plane above or substantially above (e.g. less than 10% of displaced material 58 contacting the substrate) displaced material 58. Displaced material 58 may typically be located at an edge of cell 50 due to configuration of the microreplication tool; however, displaced material may extend into any part of offset volume 56 and take any topographical configuration. While displaced material A depth relationship between working surface 44 and displaced material 58 may be illustrated in FIG. 4C. FIG. 4C illustrates a profile view of an example cell having an offset volume. Top plane 83, channel plane 55, and offset surface 54 may define offset volume 56. Working surface 44 may include a plurality of microstructures 82 forming microstructured working surface 44. The tops of the plurality of microstructures 82 may define a top plane 83 and bases of the plurality of microstructures 82 may define a base plane 85. Base plane 85 may have a base plane depth 87 from top plane 83. During polishing, a height of the plane of working surface 44 may be reduced from the top plane 83 to the base plane 85. Base plane depth 87 may represent a depth to which working surface 44 may be worn down. For example, base plane depth 87 may be an average height of the plurality of microstructures 82. To reduce polishing inconsistencies, displaced material 58 may be confined to beneath base plane 85.

Offset surface 54 may have an offset depth 68 that represents a depth from a plane of working surface 44 to a maximum designed depth of offset surface 68. In some examples, offset depth may be an actual maximum distance from working surface 44. The maximum designed depth may form an offset plane 53 parallel to working surface 44 that represents a maximum designed depth 68 of offset surface 54.

Offset surface 54 may include a nonplanar portion of displaced material 58. A nonplanar portion may include a portion that is substantially out-of-plane of designed offset surface 54. A peak of displaced material 58 may define a displacement plane 57 parallel to working surface 44. Displacement plane 57 may form a displacement depth 59 below top plane 82. In some examples, displacement plane 57 is below base plane 85, such that displaced material 58 does not substantially interfere with polishing. In some examples, displaced material 58 may be substantially below base plane 85 if greater than 90% of a volume of displaced material 58 is between offset plane 53 and base plane 85. In some examples, displaced material may be substantially below base plane 85 if a surface area of displaced material 58 above base plane 85 is less than 5% of a surface area of working surface 44.

In some embodiments, displaced material 58 may be a raised or depressed feature due to CTE mismatch with polishing layer 46 and a second layer. For example, polishing pad 40 may include the second layer beneath the polishing layer that has a different coefficient of thermal expansion than the polishing layer. When the coefficient of thermal expansion is higher for polishing layer 46 than the second layer, displaced material 58 may include raised features along channel surface 52 and below offset surface 54. When the coefficient of thermal expansion is lower for polishing layer 46 than the second layer, displaced material 58 may include depressed features along channel surface 52 and below offset surface 54.

While FIGS. 4A-4C have been described with respect to an offset surface 54 configured to restrict displaced material 58 below working surface 44, in some examples, offset surface 54 may be configured so that displaced material 58 is substantially coplanar with working surface 44. For example, displaced material 58 may be anticipated to fill a particular offset volume 56. Offset surface 54 may be configured such that displacement plane 57 has a displacement depth 59 or displacement height above top plane 83 that is within a tolerance. The tolerance may be correlated to a conditioning depth, for which working surface 44 will be reduced during conditioning of polishing pad 40. See, for example, FIGS. 5F and 5G below for configurations of offset surface 54 that may result in displaced material 58 within the tolerance. In some examples, displacement depth 59 may be less than 5 µm. In some examples, displacement depth 59 may be greater than base plane depth 87 or an average height of the plurality of microstructures 82.

Offset surface 54 may have a variety of surface orientations. As described above, a topology of offset surface 54 may change from an as-designed shape as material is displaced during manufacture. Offset surface 54 may be configured so that displaced material 58 may be substantially contained below base plane 85 or displaced material 58 may be substantially within a tolerance of top plane 83.

Figure 5A:
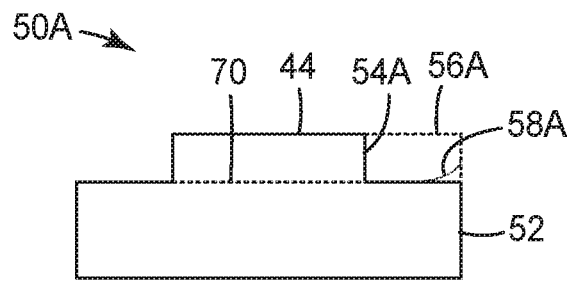
FIG. 5A illustrates a schematic cross-sectional view of an example cell in accordance with some embodiments discussed herein.

Offset surface 54 may have one or more surfaces that are or are designed to be substantially parallel to a plane of working surface 44 ("horizontal"), substantially perpendicular to a plane of working surface 44 ("vertical"), curved, angled, stepped, or the like. FIGS. 5A, 5B, 5C, 5D, 5E, 5F, and 5G are diagrams of designs of polishing pad 40 with unit cells 50 having alternative offset surface configurations. The features of FIGS. 5A-5G are not necessarily drawn to scale. FIG. 5A may be described with respect to surface features of polishing pad 40; however, it is understood that similar features may be present in FIGS. 5B-5G, as well as embodiments that are not shown.

FIG. 5A illustrates a schematic cross-sectional view of a cell 50A that includes an offset surface having a vertical component and a horizontal component, in accordance with some embodiments discussed herein. Cell 50A may include a working surface 44, a channel surface 52, and an offset surface 54A. A plane of working surface 44, a plane of channel surface 52, and offset surface 54A may define an offset volume 56A. Cell 50A may include a cross-sectional area 70 between two channel surfaces 52 on opposite sides of cell 50A. Offset surface 54A may include a substantially vertical component and a substantially horizontal component. The vertical and horizontal components of offset surface 54A may be configured to provide an offset volume 56A such that displaced material 58A displaced during cell formation may be substantially restricted to offset volume 56A. In some examples, cell 50 may be designed such that working surface 44 and cross-sectional area 70 have a particular ratio.

Figure 5B:
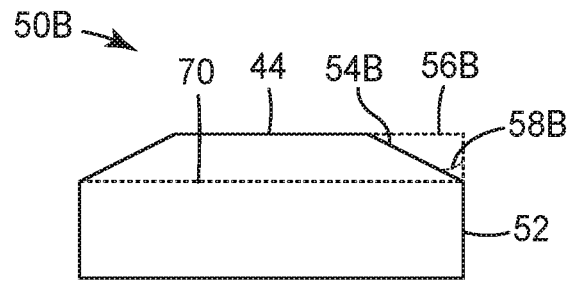
FIG. 5B illustrates a schematic cross-sectional view of an example cell in accordance with some embodiments discussed herein.

During formation of cells 50, material may be displaced due to formation of the microstructured working surface 44, the offset surface 54, and the plurality of channels 42. Reducing an amount of material displaced may allow for reduced offset volume and/or greater working surface area. In some examples, the offset surface of the cells may be angled to reduce the amount of material removed to create offset volume 56. FIG. 5B illustrates a schematic cross-sectional view of a cell 50B that includes an angled offset surface, in accordance with some embodiments discussed herein. Offset surface 54B may include an angled surface from an edge of working surface 44 to an edge of channel surface 52. In some examples, angled offset surface 54B may be a flat surface. Angled offset surface 54B may form an offset volume 56B that is smaller at the edge of working surface 44 and larger at the edge of channel surface 52, wherein displaced material 58B is more likely to agglomerate. For example, a height of offset volume 56B at the edge of channel surface 52 may be almost as high as a height of offset volume 56A of cell 50A, while offset volume 56B may be substantially smaller than offset volume 56A, causing less material displacement.

Figure 5C:
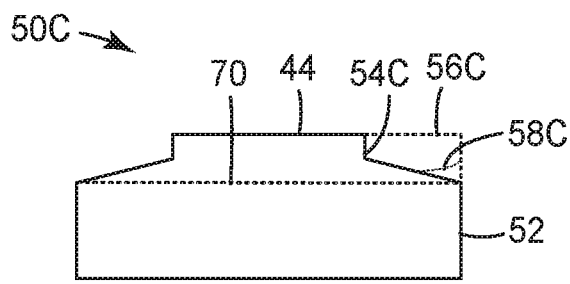
FIG. 5C illustrates a schematic cross-sectional view of an example cell in accordance with some embodiments discussed herein.

During polishing, it may be desired to have a consistent area of working surface 44 as working surface 44 is worn down. For example, a polishing pad having cells 50B of FIG. 5B may have an increased surface area of working surface 44B due to offset surface 54B immediately angling down. In some examples, the offset surface may be configured to provide a consistent area of working surface 44 while reducing an amount of material removed to create offset volume 56. FIG. 5C illustrates a schematic cross-sectional view of a cell 50C that includes an offset surface having a substantially vertical upper portion and a substantially angled lower portion, in accordance with some embodiments discussed herein. Offset surface 54C may include a substantially vertical upper portion configured to present a substantially constant surface area of working surface 44 as working surface 44 is worn down. Offset surface 54C may also include a substantially angled lower portion to reduce an amount of displaced material 58C to create offset volume 56C, as explained in FIG. 5B above.

Figure 5D:
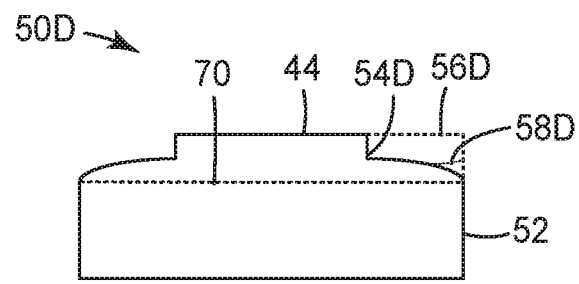
FIG. 5D illustrates a schematic cross-sectional view of an example cell in accordance with some embodiments discussed herein.

During formation of cells 50, material may be displaced to an edge of offset surface 54 near channel surface 52. In some examples, the offset surface may be curved to further reduce an amount of material removed to create offset volume 56. FIG. 5D illustrates a schematic cross-sectional view of a cell 50D that includes an offset surface having a substantially vertical upper portion and a curved lower portion, in accordance with some embodiments discussed herein. Offset surface 54D may include a curved lower portion to further reduce an amount of displaced material 58D to create offset volume 56D. For example, a height of offset volume 56D at the edge of channel surface 52 may be almost as high as a height of offset volume 56C of cell 50C, while curved offset volume 56D may be smaller than flat angled offset volume 56C, causing less material displacement.

Figure 5E:
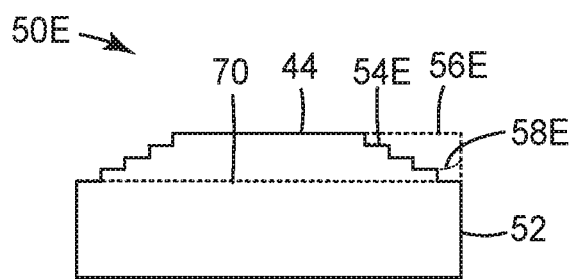
FIG. 5E illustrates a schematic cross-sectional view of an example cell in accordance with some embodiments discussed herein.

Some microreplication tools used to form cells 50 may not easily or precisely form angled or curved offset surface 54. In some examples, offset surface 54 may be stepped to reduce an amount of material displaced to create offset volume 56 using flat vertical and horizontal surfaces. FIG. 5E illustrates a schematic cross-sectional view of a cell 50E that includes a stepped offset surface 54E, in accordance with some embodiments discussed herein. Stepped offset surface 54E may form an offset volume 56E that is smaller at an edge of working surface 44 and larger at an edge of channel surface 52, such as in cell 50B, but having been formed by a tool having flat vertical and horizontal surfaces. Stepped offset surface 54E may include even spacing, as shown in FIG. 5E, or may include uneven spacing, such that a progression of stepped offset surface 54E is non-linear (e.g., curved).

Figure 5F:
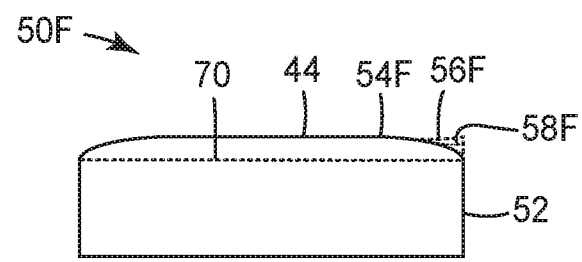
FIG. 5F illustrates a schematic cross-sectional view of an example cell in accordance with some embodiments discussed herein.
Figure 5G:
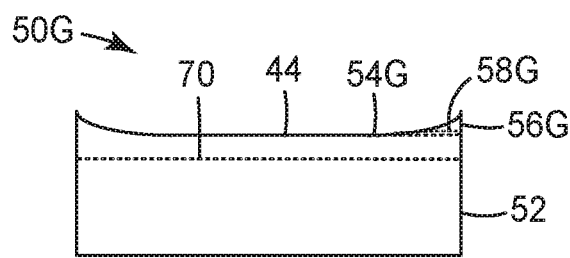
FIG. 5G illustrates a schematic cross-sectional view of an example cell in accordance with some embodiments discussed herein.

During or after cell formation, a CTE mismatch between polishing layer 46 and a second layer may cause displaced material to expand or contract into an offset volume. In some examples, offset surface 54 may be configured to account for an expansion or contraction into or out of offset volume 56. FIG. 5F illustrates a cross-sectional view of a cell 50F that includes a curved offset surface 54F that is convex. Displaced material 58F may expand into offset volume 56F. FIG. 5G illustrates a cross-sectional view of a cell 50G that includes a curved offset surface 54G that is concave. Displaced material 58G may contract out of offset volume 56G. In contrast to offset volumes 56A-56F, offset volume 56G is a volume of material that is offset from working surface 44 and from with displaced material may contract out of. If a resulting displaced material 58F or 58G is substantially small, offset surfaces 56F or 56G may be substantially co-planar with working surface 44 and may not be substantially below working surface 44 to avoid causing polishing defects.

Cell 50 may have a variety of offset lengths, offset widths, and offset heights. Offset length and offset width may be selected due to a number of factors including, but not limited to, amount of material anticipated to be displaced, material coefficient of thermal expansion, desired surface area of working surface 44, channel width and height, height of microstructures, and the like. In some examples, an offset length, width, or diameter may be in a range between 10 µm to 1 mm. In some examples, an offset length, width, or diameter may be between 1% and 50% of a cell length, width, or diameter. In some examples, an offset height may be configured to accommodate a microstructured surface on each respective cell, such that each cell is sufficiently thick to provide a desired amount of wear for polishing pad 40. In some examples, the offset height may be less than an average height of the plurality of microstructures of working surface 44. In some examples, an offset height may be configured to accommodate one or more channel walls of the plurality of channels, such that each channel of the plurality of channels has sufficient height to contain and transfer polishing fluid at a desired rate. In some examples, an offset height may be correlated with a cell height or channel height and width. For example, as cell height or channel height and width increase, more material may be displaced during microreplication, requiring a greater offset volume and corresponding offset height. In some examples, the offset height and a cell width may have a ratio in a range between 1:5 and 1:50.

Referring back to FIGS. 4A-4C, a microreplication tool for forming polishing layer 46 may be configured with a structured surface that corresponds to working surface 44, channel surface 52, and offset surface 54. The structured surface may be configured with a portion corresponding to offset surface 54 that may accommodate displacement of material during microreplication. In some examples, the structured surface may be configured with the portion corresponding to offset surface 54 so that displacement plane 57 is below base plane 85. In some examples, the structured surface may be configured with a portion corresponding to offset surface 54 so that displacement depth 59 is within a tolerance of top plane 83.

Polishing layer 46 may include a microstructured working surface 44. Cells 50 of a polishing layer 46 may include a plurality of microstructures extending from the plane of working surface 44 of each cell 50. In some examples, the plurality of microstructures may be configured to interface with abrasive particles of a polishing solution to remove material from substrate 20. In some examples, the plurality of microstructures may be configured as abrasives to directly interface with substrate 20 to remove material from substrate 20.

Figure 6A:
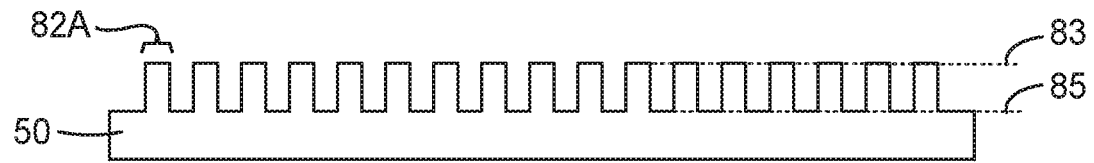
FIG. 6A illustrates a schematic cross-sectional view of a section of a surface layer having microstructures in accordance with some embodiments discussed herein.

In some embodiments, the microstructures may be configured to contact and facilitate polishing of substrate 20 having a flat or contoured surface (e.g., curved surfaces, surface indentations, and the like). FIG. 6A illustrates a schematic cross-sectional view of a working surface of cell 50 having microstructures that include asperities 82A, in accordance with some embodiments discussed herein. In the example of FIG. 6A, asperities 82A may be integrally formed with or coupled to cell 50 of polishing pad 40. In some examples, asperities 82A may include stems configured to impart flexion to the polishing elements such that the microstructures may bend to accommodate the polishing of substrates having a surface contour. Asperities 82A may have a cross-sectional shape that is convex, spherical, hemispherical, concave, cup shaped, rectangular, square, or any other desired cross-sectional shape. Microstructures may be arranged randomly across the working surface or may be arranged in a pattern, e.g. a repeating pattern, across the working surface. Patterns include, but are not limited to, square arrays, hexagonal arrays and the like. For examples of microstructures, see WO Pat. App. Pub. 2016/183126 A1, incorporated by reference herein.

Figure 6B:
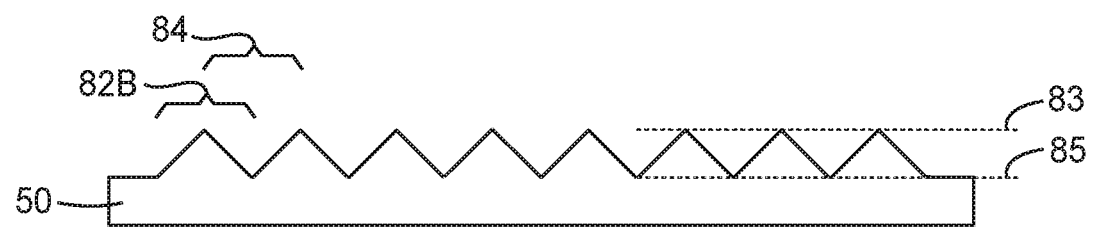
FIG. 6B illustrates a schematic cross-sectional view of a section of a surface layer having microstructures and cavities in accordance with some embodiments discussed herein.

In some examples, polishing pad 40 may include a plurality of microstructures formed by cavities that extend into working surfaces of cells of polishing pad 40 to form microstructures. FIG. 6B illustrates a schematic cross-sectional view of a section of a working surface of cell 50 having microstructures that include asperities 82B and cavities 84 in accordance with some embodiments discussed herein. The cavities may extend into polishing pad 40 at any desired distance (including entirely through polishing pad 40 and, thereby, permit flow of slurry through the cavities). Cavities 84 may have any size and shape. For example, the shape of cavities 84 may be selected from among a number of geometric shapes such as a cubic, cylindrical, prismatic, hemispherical, rectangular, pyramidal, truncated pyramidal, conical, truncated conical, cross, post-like with a bottom surface which is arcuate or flat, or combinations thereof. Alternatively, some or all of cavities 84 may have an irregular shape. In some embodiments, each of cavities 84 has the same shape. Alternatively, any number of cavities 84 may have a shape that is different from any number of the other cavities. Cavities 84 can be provided in an arrangement in which the cavities are aligned in rows and columns, distributed in a pattern (e.g., spiral, helix, corkscrew, or lattice fashion), or distributed in a "random" array (i.e., not in an organized pattern). For examples of microstructure cavities, see US Pat. App. Pub. 2016/0221146 A1, incorporated by reference herein.

Figure 6C:
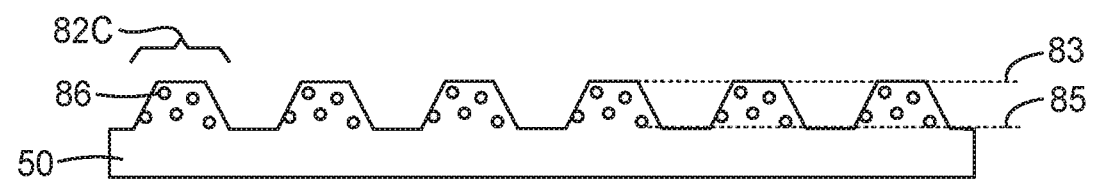
FIG. 6C illustrates a schematic cross-sectional view of a section of a surface layer having microstructures of abrasive composites that include abrasive particles in accordance with some embodiments discussed herein.

In some embodiments, polishing pad 40 may be a fixed abrasive pad, and the plurality of microstructures may be abrasive composites that include abrasive particles. FIG. 6C illustrates a schematic cross-sectional view of a section of a working surface of cell 50 having microstructures that include asperities 82C of abrasive composites that include abrasive particles 86 in accordance with some embodiments discussed herein. The fixed abrasive pad may be two-dimensional, such as a convention abrasive sheet with a layer of abrasive particles held to a backing by one or more resin or binder layers, or it may be a three-dimensional fixed abrasive, such as a resin or binder layer that contains abrasive particles dispersed therein, forming a resin/abrasive composite which has appropriate height to allow for the resin/abrasive composite to wear during use and/or dressing to expose a fresh layer of abrasive particles. The abrasive article may comprise a three-dimensional, textured, flexible, fixed abrasive construction having a first surface and a working surface. The working surface may comprise a plurality of precisely shaped abrasive composites. The precisely shaped abrasive composite may comprise a resin phase and an abrasive phase. For examples of abrasive composite microstructures, see U.S. Pat. No. 7,160,178 B2, incorporated by reference herein. The precisely shaped abrasive composites may be arranged in an array to form the three-dimensional, textured, flexible, fixed abrasive construction. The abrasive article may comprise abrasive constructions that are patterned. Abrasive articles available under the trade designation TRIZACT abrasive and TRIZACT diamond tile abrasives available from 3M Company, St. Paul, Minn., are exemplary patterned abrasives. Patterned abrasive articles include monolithic rows of abrasive composites precisely aligned and manufactured from a die, mold, or other techniques. Such patterned abrasive articles can abrade, polish, or simultaneously abrade and polish.

Figure 6D:
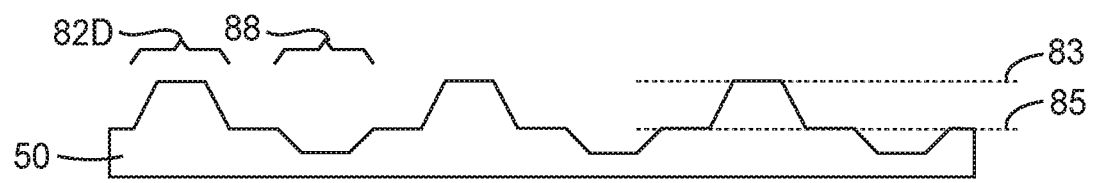
FIG. 6D illustrates a schematic cross-sectional view of a section of a working surface of a cell having microstructures that include asperities and pores in accordance with some embodiments discussed herein.

In some embodiments, polishing pad 40 may have microstructures that include asperities and/or pores. FIG. 6D illustrates a schematic cross-sectional view of a section of a working surface of cell 50 having microstructures that include asperities 82D and pores 88 in accordance with some embodiments discussed herein. The shape of pores 88 may include, but is not limited to, cylinders, half spheres, cubes, rectangular prism, triangular prism, hexagonal prism, triangular pyramid, 4, 5 and 6-sided pyramids, truncated pyramids, cones, truncated cones and the like. The shape of all the pores 88 may all be the same or combinations may be used. In some embodiments, the depth of pores 88 may be less than the thickness of a land region adjacent to each precisely shaped pore, i.e. the precisely shaped pores are not through-holes that go through the entire thickness of the land region. This enables the pores to trap and retain fluid proximate the working surface. Pores 88 may be uniformly distributed, i.e. have a single areal density, across the surface of the polishing layer or may have different areal density across the surface of the polishing layer. Pores 88 may be arranged randomly across the surface of the polishing layer or may be arranged in a pattern, e.g. a repeating pattern, across the polishing layer. Patterns include, but are not limited to, square arrays, hexagonal arrays, and the like. Combination of patterns may be used. For examples of asperities and pores, see WO Pat. App. Pub. 2015/153601 A1, incorporated by reference herein.

In some embodiments, polishing solution 30 may be used with polishing pad 40 in a polishing operation. Polishing solution 30 (commonly referred to as a "slurry") of the present disclosure may include a fluid component having abrasive composites dispersed and/or suspended therein.

In various embodiments, the fluid component may be non-aqueous or aqueous. Non-aqueous fluid components may include alcohols, acetates, ketones, organic acids, ethers, or combinations thereof. Aqueous fluid components may include (in addition to water) non-aqueous fluid components, including any of the non-aqueous fluids described above. When the fluid component includes both aqueous and non-aqueous fluids, the resulting fluid component may be homogeneous, i.e. a single-phase solution. In illustrative embodiments, the fluid component may be selected such that the abrasive composite particles are insoluble in the fluid component.

In some embodiments, the fluid component may further include one or more additives such as, for example, dispersion aids, rheology modifiers, corrosion inhibitors, pH modifiers, surfactants, chelating agents/complexing agents, passivating agents, foam inhibitor, and combinations thereof. Dispersion aids are often added to prevent the sagging, settling, precipitation, and/or flocculation of the agglomerate particles within the slurry, which may lead to inconsistent or unfavorable polishing performance. Useful dispersants may include amine dispersants, which are reaction products of relatively high molecular weight aliphatic or alicyclic halides and amines. Rheology modifiers may include shear thinning and shear thickening agents. Shear-thinning agents may include polyamide waxes coated on polyolefin polymer material. Thickening agents may include fumed silica, water-soluble polymers, and non-aqueous polymers. Corrosion inhibitors that may be added to the fluid component include alkaline materials, which can neutralize the acidic byproducts of the polishing process that can degrade metal such as triethanolamine, fatty amines, octylamine octanoate, and condensation products of dodecenyl succinic acid or anhydride and a fatty acid such as oleic acid with a polyamine. Suitable pH modifiers which may be used include alkali metal hydroxides, alkaline earth metal hydroxides, basic salts, organic amines, ammonia, and ammonium salts. Buffer systems may also be employed. The buffers can be adjusted to span the range from acidic to near-neutral to basic. Surfactants that may be used include ionic and nonionic surfactants. Nonionic surfactants may include polymers containing hydrophilic and hydrophobic segments. Ionic surfactants may include both cationic surfactants and anionic surfactants. Anionic Surfactants are dissociated in water in an amphiphilic anion, and a cation, which is in general an alkaline metal (Na+, K+) or a quaternary ammonium. Surfactants may be used alone or in combination of two or more.

Complexing agents, such as ligands and chelating agents, may be included in the fluid component, particularly when the application relates to metal finishing or polishing, where metal swarf and or metal ions may be present in the fluid component during use. The oxidation and dissolution of metal can be enhanced by the addition of complexing agents. These compounds can bond to metal to increase the solubility of metal or metal oxides in aqueous and non-aqueous liquids. Complexing agents may include carboxylic acids and salts thereof that having one carboxyl group (i.e., monofunctional carboxylic acids) or a plurality of carboxylic acid groups (i.e., multifunctional carboxylic acids). Passivating agents may be added to the fluid component to create a passivating layer on substrate 20 being polished, thereby altering the removal rate of material from substrate 20 or adjusting the removal rate of one material relative to another material, when substrate 20 contains a surface that includes two or more different materials. Foam inhibitors that may be used include silicones; copolymers of ethyl acrylate and 2-ethylhexylacrylate; and demulsifiers. Other additives that may be useful in the fluid component include oxidizing and/or bleaching agents such as, e.g. hydrogen peroxide, nitric acid, and transition metal complexes such as ferric nitrate; lubricants; biocides; soaps and the like. In various embodiments, the concentration of an additive class, i.e. the concentration of one or more additives from a single additive class, in the polishing solution may be at least about 0.01 wt. % and less than about 20 wt. % based on the weight of the polishing solution.

The abrasive composites may include porous ceramic abrasive composites. The porous ceramic abrasive composites may include individual abrasive particles dispersed in a porous ceramic matrix. As used herein the term "ceramic matrix" includes both glassy and crystalline ceramic materials. In illustrative embodiments, at least a portion of the ceramic matrix includes glassy ceramic material. In various embodiments, the ceramic matrixes may include glasses that include metal oxides, for example, aluminum oxide, boron oxide, silicon oxide, magnesium oxide, sodium oxide, manganese oxide, zinc oxide, and mixtures thereof. As used herein the term "porous" is used to describe the structure of the ceramic matrix which is characterized by having pores or voids distributed throughout its mass. The pores may be open to the external surface of the composite or sealed. Pores in the ceramic matrix are believed to aid in the controlled breakdown of the ceramic abrasive composites leading to a release of used (i.e., dull) abrasive particles from the composites. The pores may also increase the performance (e.g., cut rate and surface finish) of the abrasive article, by providing a path for the removal of swarf and used abrasive particles from the interface between the abrasive article and the workpiece. The voids may comprise from about at least 4 volume % of the composite and less than 95 volume % of the composite. In some embodiments, the abrasive particles may include diamond, cubic boron nitride, fused aluminum oxide, ceramic aluminum oxide, heated treated aluminum oxide, silicon carbide, boron carbide, alumina zirconia, iron oxide, ceria, garnet, and combinations thereof. In various embodiments, the abrasive composite particles of the present disclosure may also include optional additives such as fillers, coupling agents, surfactants, foam suppressors and the like. The amounts of these materials may be selected to provide desired properties.

The abrasive composites may be sized and shaped relative to the size and shape of microstructures of polishing pad 40 such that one or more (up to all) of the abrasive composites may be at least partially disposed within a cavity. More specifically, the abrasive composites may be sized and shaped relative to the cavities or microstructures such that one or more (up to all) of the abrasive composites, when fully received by a cavity or in between microstructures, has at least a portion that extends beyond the cavity opening or microstructure gap. As used herein, the phrase "fully received," as it relates to the position of a composite within a cavity or microstructure gap, refers to the deepest position the composite may achieve within a cavity or microstructure gap upon application of a non-destructive compressive force (such as that which is present during a polishing operation, as discussed below). In this manner, as will be discussed in further detail below, during a polishing operation, the abrasive composite particles of polishing solution 30 may be received in and retained by (e.g., via frictional forces) the cavities or microstructure gaps, thereby functioning as an abrasive working surface.

In various embodiments, the abrasive composite particles may be precisely-shaped or irregularly shaped (i.e., non-precisely-shaped). Precisely-shaped ceramic abrasive composites may be any shape (e.g., cubic, block-like, cylindrical, prismatic, pyramidal, truncated pyramidal, conical, truncated conical, spherical, hemispherical, cross, or post-like). The abrasive composite particles may be a mixture of different abrasive composite shapes and/or sizes. Alternatively, the abrasive composite particles may have the same (or substantially the same) shape and/or size. Non-precisely shaped particles include spheroids, which may be formed from, for example, a spray drying process. In various embodiments, the concentration of the abrasive composites in the fluid component may be at least 0.065 wt. % and less than 6.5 wt. %. In some embodiments, both the ceramic abrasive composites and the parting agent used in their fabrication can be included in the fluid component. In these embodiments, the concentration of the abrasive composites and the parting agent in the fluid component may be at least 0.1 wt. % and less than 10 wt. %.

In some embodiments, the abrasive composite particles of the present disclosure may be surface modified (e.g., covalently, ionically, or mechanically) with reagents which will impart properties beneficial to abrasive slurries. For example, surfaces of glass can be etched with acids or bases to create appropriate surface pH. Covalently modified surfaces can be created by reacting the particles with a surface treatment comprising one or more surface treatment agents. The surface treatment agents may be used to adjust the hydrophobic or hydrophilic nature of the surface it is modifying. Sputtering, vacuum evaporation, chemical vapor deposition (CVD) or molten metal techniques can be used.

Figure 7:
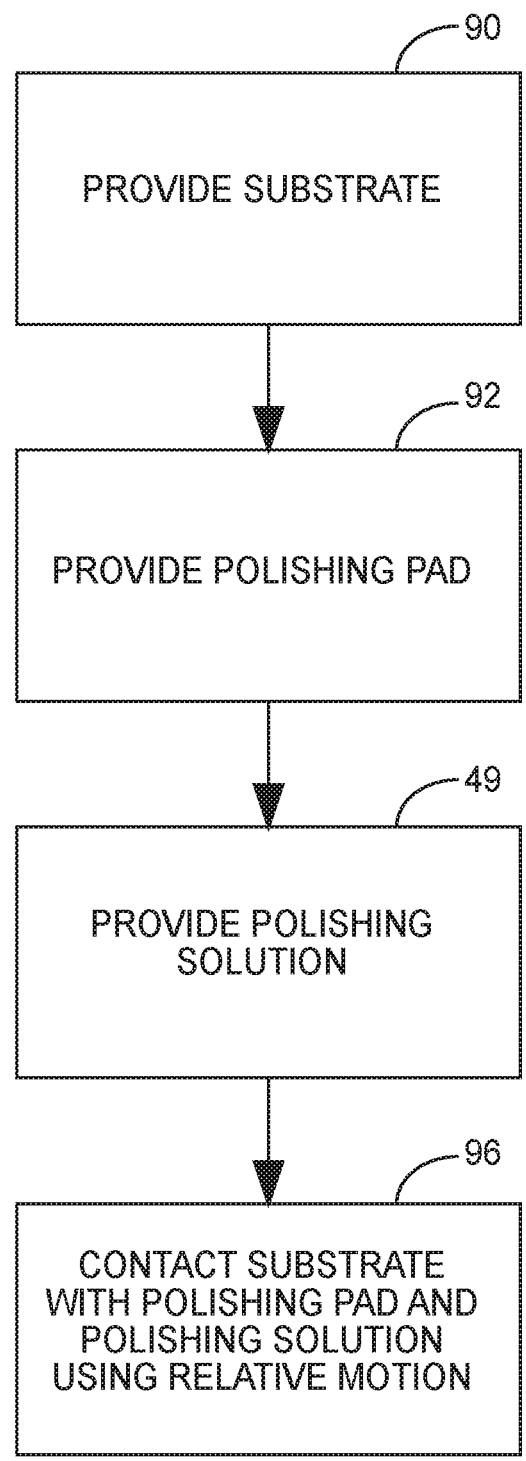
FIG. 7 is a flow diagram of an example method for polishing a substrate in accordance with some embodiments discussed herein.

The present disclosure further relates to method of polishing substrates using polishing pads as discussed herein. FIG. 7 is a flow diagram of an example method for polishing a substrate in accordance with some embodiments discussed herein. The methods may be carried out using a polishing system such as that described with respect to FIG. 1, or with any other conventional polishing system, e.g. single or double-sided polishing and lapping.

In some embodiments, a method of polishing substrate may include providing a substrate, such as substrate 20, to be polished (90). The method may further include providing a polishing pad (92) and a polishing solution (94), such as polishing pad 40 and polishing solution 30, respectively. The method may further include contacting a surface of the substrate with the polishing pad and the polishing solution while there is relative motion between the polishing pad and the substrate (96). For example, referring to the polishing system of FIG. 1, carrier assembly 16 may apply pressure to substrate 20 against polishing surface 18 of polishing pad 40 (which may be coupled to platen 12) in the presence of polishing solution 30 as platen 12 is moved (e.g., translated and/or rotated) relative to carrier assembly 16. Additionally, carrier assembly 16 may be moved (e.g., translated and/or rotated) relative to platen 12. As a result of the pressure and relative motion, the abrasive particles (which may be contained in/on polishing pad 40 and/or polishing solution 30) may remove material from the surface of substrate 20.

In illustrative embodiments, the systems and methods of the present disclosure are particularly suited for the finishing of ultra-hard substrates such as sapphire, A, R, or C planes. Finished sapphire crystals, sheets or wafers are useful, for example, in the light emitting diode industry and cover layer for mobile hand-held devices. In such applications, the systems and methods provide persistent removal of material. Furthermore, it has been discovered that systems and methods of the present disclosure can provide a removal rate commensurate with that achieved with large abrasive particle sizes conventionally employed, while providing a surface finish comparable to that achieved with small particle sizes conventionally employed. Still further, the systems and methods of the present disclosure are capable of providing persistent removal rates without extensive dressing of the pad, such as required with fixed abrasive pads.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

Polishing Pad Preparation

A polishing pad was prepared as follows. A sheet of polycarbonate was laser ablated, as described in U.S. Pat. No. 6,285,001, to form a master tool. The master tool was plated with nickel to form a nickel negative. Several nickel negatives were formed and welded together to form an embossing roll. The embossing roll was used in an embossing process, as described in U.S. Patent Application Publication No. 2010/0188751, for a thermoplastic polyurethane to form a polishing layer. Variations of the polishing layer will be described below.

Offset Volume

In some examples, a polishing layer may have cells with recessed edges creating an offset volume for polymer displacement during microreplication, as described above. In a first example, a polishing layer was recessed from an edge of a base layer 15 microns high and 500 microns offset. In a second example, a polishing layer was recessed from an edge of a base layer 30 microns high and 750 microns offset.

Figure 9A:
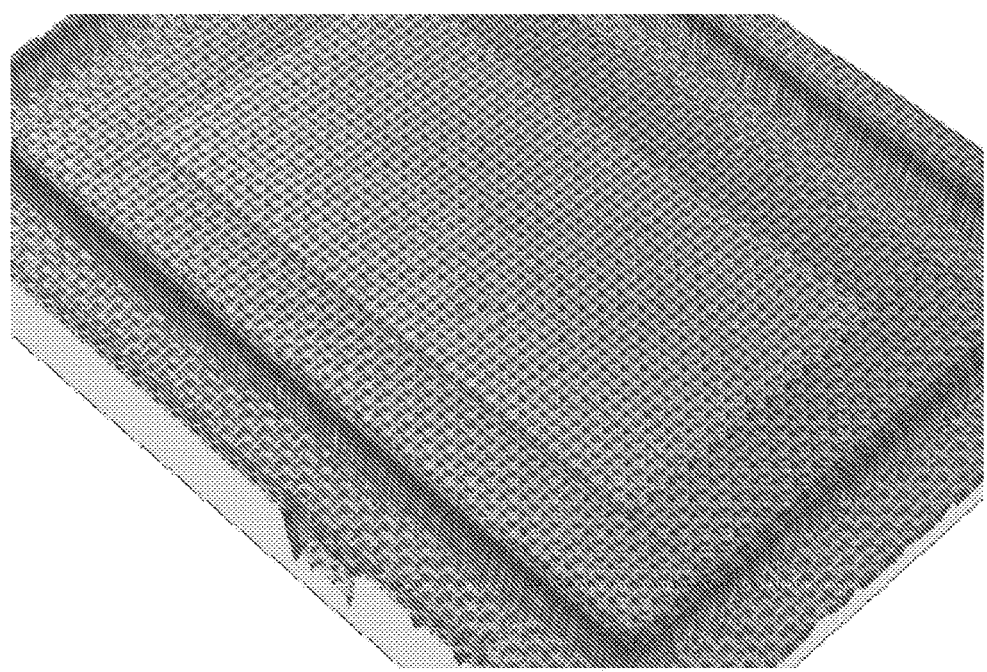
FIG. 9A is a height map of a cell in accordance with some embodiments discussed herein.
Figure 9B:
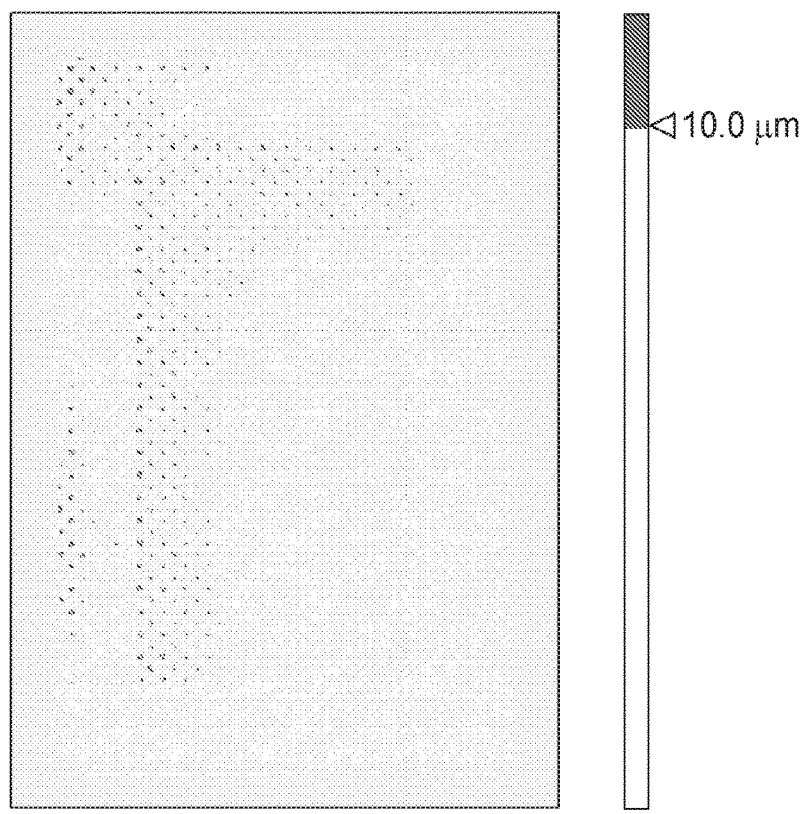
FIG. 9B is a simulated map of contact area of a cell in accordance with some embodiments discussed herein.

FIG. 9A is a height map of a cell in the polishing pad of the first example. FIG. 9B is a simulated map of contact area of the cell in the polishing pad of the first example after 10 microns of wear. The dots of FIG. 9B illustrate areas where the polishing pad would be in contact with a wafer. As seen in FIG. 9B, the working layer has non-uniform contact with the wafer and the base layer has significant contact with the wafer at left and top edges.

Figure 10A:
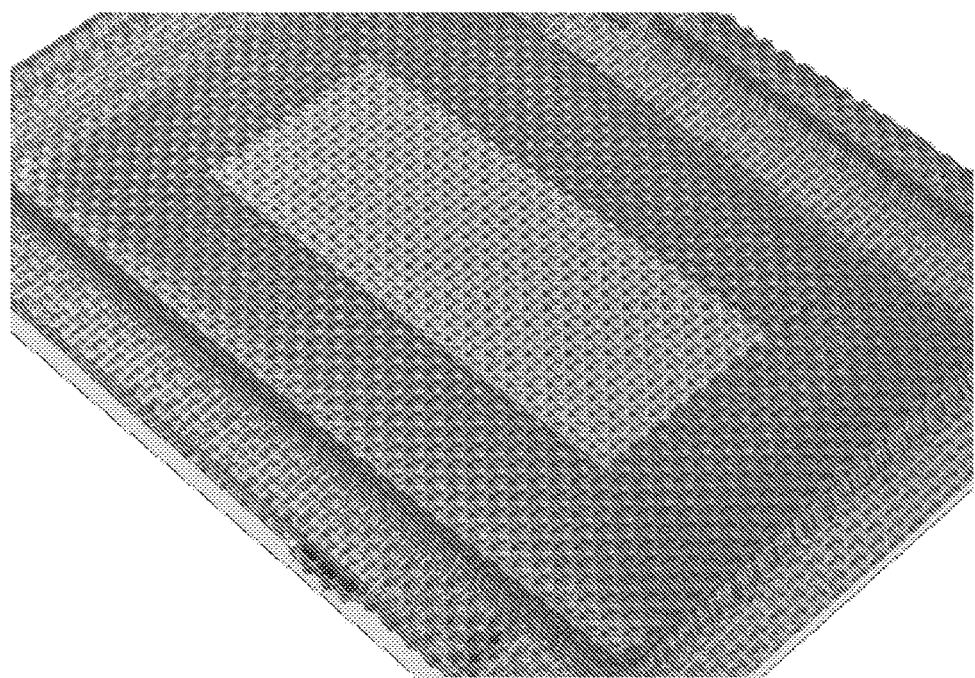
FIG. 10A is a height map of a cell in accordance with some embodiments discussed herein.
Figure 10B:
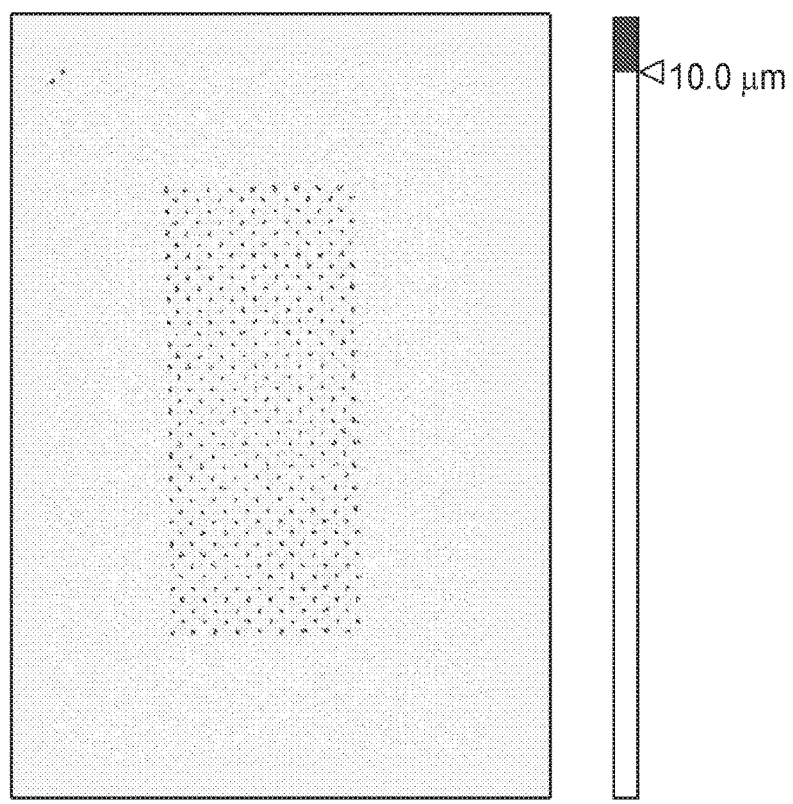
FIG. 10B is a simulated map of contact area of a cell in accordance with some embodiments discussed herein.

FIG. 10A is a height map of a cell in the polishing pad of the second example. FIG. 10B is a simulated map of contact area of the cell in the polishing pad of the second example after 10 microns of wear. As seen in FIG. 10B, the working layer has uniform contact with the wafer and the base layer has significantly lower contact than the first example.

Various embodiments of the invention have been described. These and other embodiments are within the scope of the following claims.

The invention claimed is:

1. An article, comprising:
a polishing layer that includes a plurality of raised cells separated by a plurality of channels, wherein each of the plurality of raised cells includes:
a microstructured working surface that includes a plurality of microstructures, wherein tops of the plurality of microstructures define a top plane and bases of the plurality of microstructures define a base plane;
a substantially vertical channel surface defining a wall of a channel of the plurality of channels, wherein the channel surface defines a channel plane; and
an offset surface between an edge of the working surface and an upper edge of the channel surface;
wherein the offset surface includes a nonplanar portion of displaced material, and wherein a peak of the displaced material defines a displacement plane parallel to the working surface,
wherein the displacement plane is below the base plane.

2. The article of claim 1, wherein a depth of the displacement plane from the top plane is greater than an average height of the plurality of microstructures.

3. The article of claim 1, wherein a depth of the displacement plane from the top plane is at least 10 µm.

4. The article of claim 1, wherein the top plane, the channel plane, and the offset surface define an offset volume.

5. The article of claim 4, wherein the edge of the working surface is offset from an adjacent channel plane by an offset width or offset length.

6. The article of claim 5, wherein the offset width or offset length is between about 10 µm and 1 mm.

7. The article of claim 5, wherein the offset width or offset length is between about 1% and about 50% of a width or length of the working surface.

8. The article of claim 1, wherein the raised cells are polygonal.

9. The article of claim 1, wherein the plurality of cells are in a herringbone, cross-hatch, or curved pattern.

10. The article of claim 1, wherein at least a portion of the offset surface has a substantially vertical stepped surface.

11. The article of claim 1, wherein the offset surface is at least one of stepped, angled, and curved.

12. The article of claim 1, wherein the offset surface includes a substantially vertical upper portion and an angled lower portion.

13. The article of claim 1, further comprising a second layer beneath the polishing layer that has a different coefficient of thermal expansion than the polishing layer.

14. A system, comprising:
a carrier assembly configured to hold a substrate;
a polishing pad comprising the article of claim 1;
a platen coupled to the polishing pad;
a polishing solution comprising a fluid component and an abrasive component, and
wherein the system is configured to move the polishing pad relative to the substrate.

15. A method, comprising:
providing a substrate having a major surface;
providing a polishing pad comprising the article of claim 1;
providing a polishing solution comprising a fluid component and an abrasive component; and
contacting the major surface of the substrate with the polishing pad and the polishing solution while there is relative motion between the polishing pad and the major surface of the substrate.

* * * * *